(12) United States Patent
Kruwinus et al.

(10) Patent No.: US 7,179,753 B2
(45) Date of Patent: Feb. 20, 2007

(54) PROCESS FOR PLANARIZING SUBSTRATES OF SEMICONDUCTOR TECHNOLOGY

(75) Inventors: Hans-Jurgen Kruwinus, Bodensdorf (AT); Reinhard Sellmer, Villach (AT)

(73) Assignee: Sez AG, Villach (AT)

( * ) Notice: Subject to any disclaimer, the term of this patent is extended or adjusted under 35 U.S.C. 154(b) by 284 days.

(21) Appl. No.: 10/143,904

(22) Filed: May 14, 2002

(65) Prior Publication Data

US 2003/0087528 A1 May 8, 2003

Related U.S. Application Data

(62) Division of application No. 09/159,097, filed on Sep. 23, 1998, now abandoned.

(30) Foreign Application Priority Data

Sep. 30, 1997 (AT) ..................................... 1658/97

(51) Int. Cl.
*H01L 21/302* (2006.01)
*H01L 21/461* (2006.01)

(52) U.S. Cl. .............................. 438/748; 257/E21.219; 257/E21.23

(58) Field of Classification Search ................ 438/626, 438/629, 631, 669, 672, 745, 748, 754, 756, 438/747, 757
See application file for complete search history.

(56) References Cited

U.S. PATENT DOCUMENTS

| | | | | |
|---|---|---|---|---|
| 3,751,314 A | * | 8/1973 | Rankel | 438/563 |
| 3,976,524 A | * | 8/1976 | Feng | 438/424 |
| 4,080,246 A | | 3/1978 | Battisti et al. | 216/103 |
| 5,049,234 A | * | 9/1991 | Madhusudhan | 216/107 |
| 5,300,463 A | * | 4/1994 | Cathey et al. | 438/703 |
| 5,486,234 A | * | 1/1996 | Contolini et al. | 216/91 |
| 5,487,398 A | | 1/1996 | Ohmi et al. | 134/95.1 |
| 5,714,407 A | | 2/1998 | Maeno et al. | 438/701 |
| 5,942,449 A | * | 8/1999 | Meikle | 438/747 |
| 6,048,789 A | * | 4/2000 | Vines et al. | 438/633 |
| 6,096,233 A | * | 8/2000 | Taniyama et al. | 216/92 |
| 6,140,233 A | * | 10/2000 | Kwag et al. | 438/669 |
| 6,232,228 B1 | * | 5/2001 | Kwag et al. | 438/669 |
| 6,300,186 B1 | * | 10/2001 | Hirota et al. | 438/239 |
| 6,660,655 B2 | * | 12/2003 | Lai | 438/745 |

FOREIGN PATENT DOCUMENTS

EP 0 223 920 B1 1/1991

OTHER PUBLICATIONS

Wolf, Silicon Processing for the VLSI Era: vol. 2-Process Integration, Lattice Press, 1990, pp. 211-212.*

* cited by examiner

*Primary Examiner*—David A. Zarneke
(74) *Attorney, Agent, or Firm*—Young & Thompson

(57) ABSTRACT

In a process for planarization of semiconductor substrates in which a layer which has been applied to a semiconductor substrate which has a trench and/or contact holes is removed such that the layer remains solely in the area of the trenches or contact holes, instead of as in the prior art the etching medium being applied in drops, the etching medium is applied in a continuous flow with a flow rate of at least 0.4 l/min so that the etching medium covers the entire surface of the semiconductor substrate to be planarized. This technique yields a differentiated etching rate, the etching speed in the area of the fields between the trenches or contact holes being greater than in the area of the trenches themselves, so that as a result the coating applied to the semiconductor substrate is etched away more quickly than in the area of the trenches and finally material remains only in the area of the trenches or contact holes.

12 Claims, 2 Drawing Sheets

1μm

1 μm

PROCESS FOR PLANARIZING SUBSTRATES OF SEMICONDUCTOR TECHNOLOGY

This application is a division of application Ser. No. 09/159,097, filed on Sep. 23, 1998 now abandoned, the entire contents of which are hereby incorporated by reference.

BACKGROUND OF THE INVENTION

The invention relates to a process for planarization of substrates in semiconductor engineering by removal of a layer which can consist of metal, for example copper or aluminum, or of another substance such as polycrystalline silicon, polycrystalline suicides or silicon dioxide ($SiO_2$), from the semiconductor substrates.

In particular the process as claimed in the invention relates to removing this coating by planarization such that the layer on the surface of the semiconductor substrate is removed, but remains in trenches or contact holes which are provided in the semiconductor substrate so that conductor tracks or insulating tracks form there.

It will be possible to carry out the process as claimed in the invention without a prior (mechanical) polishing step in one step using a liquid etching medium.

U.S. Pat. No. 5,486,234 A discloses a process for removing metal which is located on the one hand on the surface of a substrate and on the other in trenches or contact holes in the substrate.

FIGS. 1a through 1d show the process known from U.S. Pat. No. 5,486,234 A using a schematic section through a semiconductor substrate. FIG. 1a shows semiconductor substrate 1 on which insulator layer 2 (for example, a layer of silicon dioxide ($SiO_2$) is applied, into which by means of lithography trenches have been etched which are later to represent conductor tracks. A thin barrier layer which is not shown, for example, of titanium, is applied to this insulator layer 2. Then metal layer 3 is applied to this barrier layer. Application of metal layer 3 (see FIG. 1b) can take place by electroplating. Surface 4 of metal layer 3 shows trenches 5 which are known, although they are not shown in FIG. 3 of U.S. Pat. No. 5,486,234 A. If uniformly acting etching is used, these trenches would become deeper, so that it is not possible to achieve the desired end result (FIG. 1d) by subjecting the substrate shown in FIG. 1b to a uniform etching process. The previously known metal etching processes (spraying, dripping of etching media onto the surface of a rotating semiconductor substrate (wafer) makes an intermediate step necessary in order to remove most of the metal of metal layer 3 which was applied to the barrier layer. This is done to ensure that before etching begins surface 6 is flat, as shown in FIG. 1c. This polishing (levelling off) can be electropolishing, as suggested in U.S. Pat. No. 5,486,234.

Another disadvantage of the known spray and drip etching is that only low etching rates (0.02 to 1.34 µ/min) are reached. In order to achieve the desired result within a reasonable period of time, most of the metal of layer 3 must be removed using another process (for example, by electropolishing).

EP 0 223 920 B1 describes plasma etching or reactive ion etching with planarization means (for example SOG=spin on glass) as a planarization method. In particular, EP 0 223 920 B1 suggests the known process of chemical mechanical polishing as the planarization process.

SUMMARY OF THE INVENTION

With the process as claimed in the invention for making conductor tracks or insulator tracks in a substrate in semiconductor engineering, a process is to be made available in which the metal applied by electroplating for example or another material which after application forms an uneven surface and in particular depressions in the area of trenches, shall be removed by a single wet etching process in such a way that the metal or other material is removed completely from the fields, therefore up to insulator layer 2, but is removed in the trenches or contact holes only to the extent that a mainly smooth surface remains.

This objective is achieved as claimed in the invention by a process which has the features of claim 1.

Preferred and advantageous embodiments of the process as claimed in the invention are the subject matter of the dependent claims.

DESCRIPTION OF THE PREFERRED EMBODIMENTS

It is possible with the invention to ensure different etching rates over field 3a and over trenches 3b filled with layer 3 in insulator layer 2 so that a purely wet chemical process which is suitable for planarization is made available.

The process as claimed in the invention ensures that the etching rate is much higher for the material (metal or other material) in the area of the fields between the trenches or contact holes than the etching rate over the trenches or contact holes.

It is advantageous here that the process as claimed in the invention is very simple to execute, since the etching liquid need simply be poured in a continuous flow onto the surface of the rotating semiconductor substrate (wafer).

It is advantageous for the etching medium to be applied with a volumetric flow of over 0.4 l/minute.

It is important that no droplet formation occurs on the surface of the semiconductor substrate, since this would lead to undesirable uniform etching and would prevent the sought-after homogenization (planarization) of the surface of the semiconductor substrate.

Unexpectedly, with the process as claimed in the invention different etching rates are achieved in such a way as to planarize the surface. The reason for this is the circumstance that directly over the surface of the substrate a layer forms in which the etching medium applied in a continuous flow remains almost stationary with respect to the substrate, due to friction and viscosity, and that the exchange of reactants (etchant) on the one hand and of etching products on the other hand takes place only slowly due to this stationary layer, so that in the deeper areas (that is, in the area of trenches or contact holes), on account of the longer diffusion time due to the longer diffusion path and the concomitant lower etching rate, removal occurs over a longer period of time than in the shallower areas of the stationary layer, since there the mass exchange is considerably faster and takes considerably less time. Using the example of etching of copper with nitric acid this means that the nitrate ions ($NO_3^+$) which are consumed on the etching medium-copper boundary surface can now be replaced by diffusion through the layer of etching medium which directly adjoins the boundary surface and which moves only little or not at all. Furthermore, in the case of the example of etching of copper with nitric acid in the area of the etching medium layer directly over the boundary surface, a high level of enrichment of hydrogen, copper ions, and $NO_x$ compounds occurs which likewise influence the etching speeds in the sense of a reduction.

The longer it takes until these reaction products diffuse out of the etchant layer directly adjacent to the boundary surface and are removed by the upper moving areas, the smaller the etching rate in the area of the trenches than in the area of the bridges or fields between the trenches.

Figure 1A:
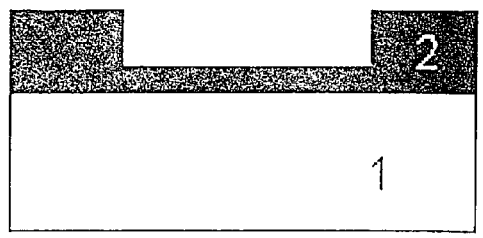
FIGS. 1a–1d illustrate a sequence of steps in a conventional planarization process.
Figure 2A:
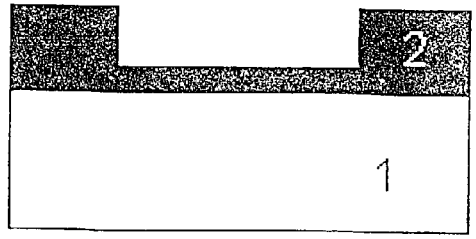
FIGS. 2a–2c illustrate a sequence of steps in an embodiment of the present invention.
Figure 1B:
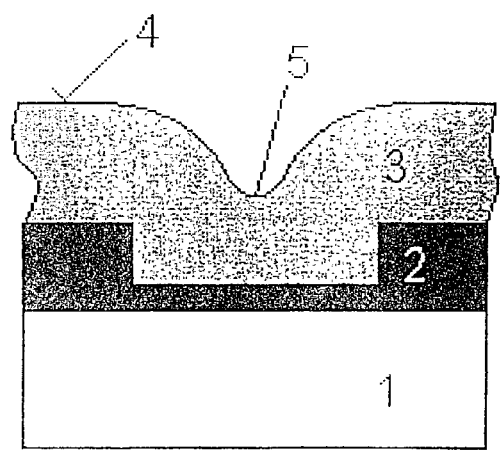
Figure 2B:
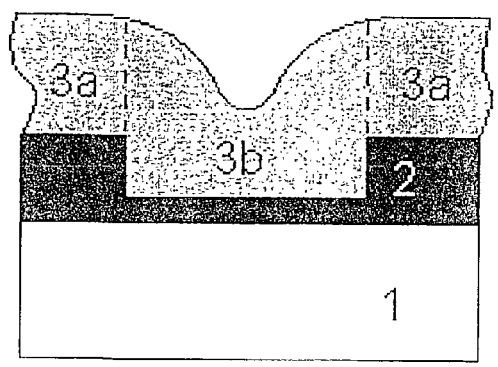
Figure 1C:
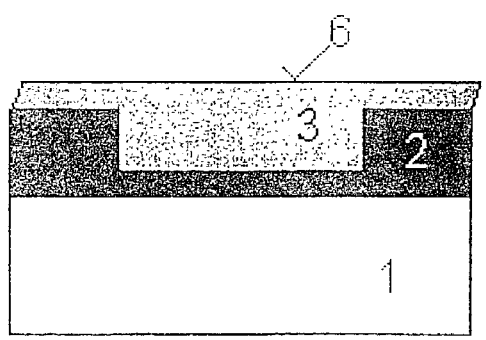
Figure 2C:
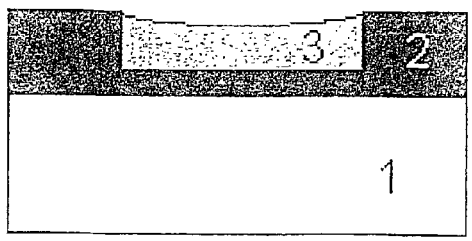
Figure 1D:
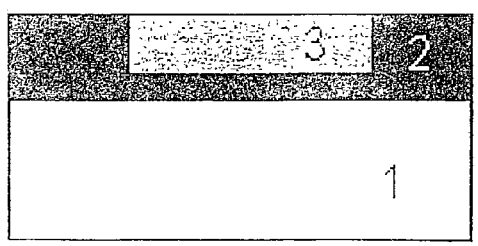

Thus, as is shown in FIGS. 2a to 2c, a situation is obtained in which proceeding from substrate 1 which is provided with coating 3 and to which is applied insulator layer 2 on which there can be a barrier layer (not shown), in a single step planarization is achieved, so that the material of coating 3 in area 3a of the fields between the trenches is entirely removed, but in area 3b of the trenches (due to the smaller etching rates there—longer diffusion path!) it essentially remains flat and fills these trenches to form conductor tracks or insulator tracks.

In the process as claimed in the invention, in the trenches, besides metals such as copper or aluminum, there also can be polycrystalline silicon and polycrystalline silicides (such as tungsten silicide) or also silicon dioxide ($SiO_2$) as coating 3. If the coating is $SiO_2$, layer 2 in which the trenches are located consists preferably and mainly of silicon.

It goes without saying that in the process as claimed in the invention etchants are used which develop an etching action with respect to the material which forms as coating 3.

The process as claimed as in the invention therefore takes place such that the etchant (a liquid) is applied in a continuous volumetric flow which covers and flows along the entire semiconductor substrate surface to be treated; this is done by the semiconductor substrate being caused to rotate.

Because in the process as claimed in the invention, not as in the prior art where etching liquids which have been sprayed on or applied in drops are used, but the etching liquid in a continuous volumetric flow is applied to the substrate preferably with a flow rate of not less than 1 l/min, but more than 0.4 l/min, recovery and re-use of the etching liquid, optionally after treatment thereof, can be done to special advantage, since more volume is available for handling when the etching liquid runs in a circuit in which it is reprocessed.

It has been ascertained to be especially advantageous in the process as claimed in the invention if the nozzle is not stationary relative to the axis of rotation of the rotating substrate, but is moving against to it. In this case the paths of motion of the nozzle from which the volumetric flow of etching liquid emerges and which move along a diameter or a secant with respect to the substrate are especially advantageous. In practical tests it has been found that a nozzle path which moves past at a short distance from the center of rotation of the substrate to be planarized, therefore moves the volumetric flow of the etching liquid with respect to the outside peripheral edge along a secant, yields especially good results. It has also proven favorable if the motion of the nozzle and thus the motion of the volumetric flow of etching liquid emerging from it take place relative to the turning substrate at greater speed.

If the volumetric flow relative to the turning substrate is moved along a path, therefore the area in which the etching liquid strikes the rotating substrate which essentially corresponds to a secant, the advantage arises that at the center of rotation there is no amount of liquid at rest, but the layer or the film of etching liquid moves uniformly over the entire surface and flows along over the surface.

It is especially advantageous in the etching of metals (for example, copper) to use special etching mixtures which make it possible in only one etching step to remove material 3a located on the field, the upper part of material 3b in the trench and part 7a of the barrier layer on the field (FIGS. 3a–4d). The etching mixture consists of two components A and B in addition to the solvent (water).

Component A is an oxidizer (for example, nitric acid, potassium bichromate, chromic sulfuric acid, ammonium or sodium persulfate). Ammonium or sodium persulfate are especially well suited.

Component B is an acid or a salt with which the oxidized material of the barrier layer forms an (easily) soluble salt or an easily soluble complex (for example, a hydrohalic acid (for example, hydrofluoric acid), oxalic acid). Hydrofluoric acid is especially well suited.

Moreover, the addition of component C makes the etching result much more uniform. This additive (component C) reduces the etching speed (at otherwise the same concentration of components A, B and the same temperature) and thus makes the result more uniform. Component C reduces the dielectricity of the etching solution. Monovalent or polyvalent alcohols or their derivatives (for example, methanol, ethanol, isopropanol, glycol, glycerin, acetic acid ethyl ester, polyethylene glycol) are especially suited for this purpose. Polyvalent alcohols or their derivatives (glycol, glycerin, polyethylene glycol) are especially well suited for this purpose.

The action of these etching mixtures is described using FIGS. 3a–d or 4a–d for producing conductor tracks which represent a schematic cross section of a semiconductor substrate.

Figure 3A:
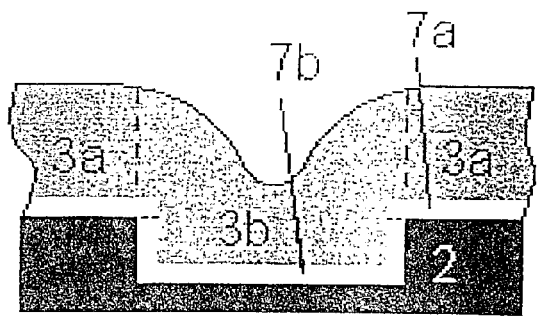
FIGS. 3a–3d illustrate a sequence of steps in a further embodiment of the present invention.
Figure 4A:
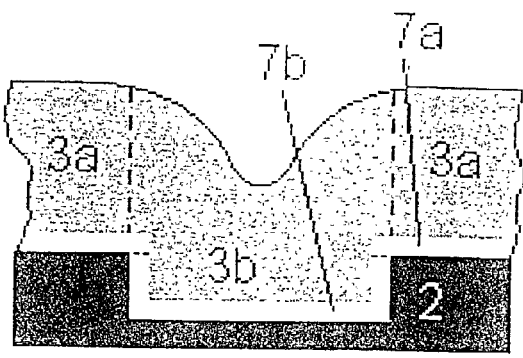
FIGS. 4a–4d illustrate a sequence of steps in another embodiment of the present invention.
Figure 3B:
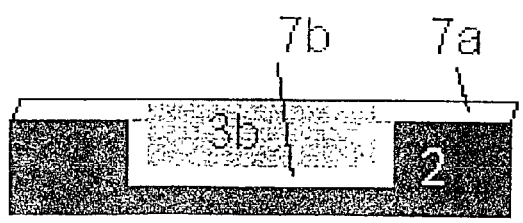
Figure 4B:
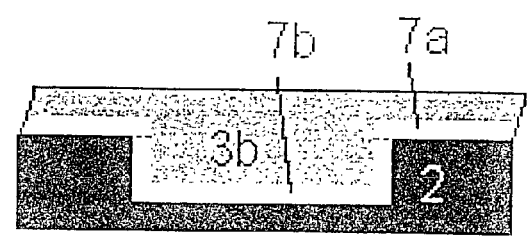
Figure 3C:
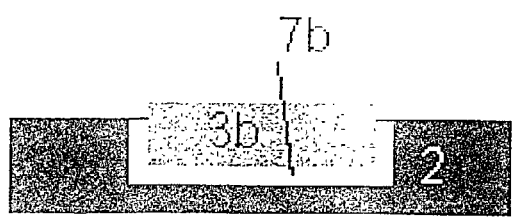

In insulator layer 2 which consists of $SiO_2$, in a depression (trench or contact hole) and on the field, first a roughly 10 nm thick barrier layer 7a, 7b (for example titanium, tantalum, titanium nitride, tantalum nitride or chromium) and thereon layer 3a, 3b of a good conducting metal (for example, copper) are applied (FIGS. 3a, 4a). In FIG. 4a layer 3a of the good conducting metal is somewhat thicker. The reason for this can be for example irregular application of the metal layer on a semiconductor substrate (wafer).

After advanced etching (FIGS. 3b, 4b) in certain areas of the semiconductor substrate (wafer) barrier layer 7a on the field is exposed (FIG. 3b), while for other areas etching of metal layer 3a and the upper part of area 3b still takes place.

Surprisingly, it has been found that at the instant at which barrier layer 7a begins to be attacked metal layer 3b is hardly attacked any more at all.

Figure 4C:
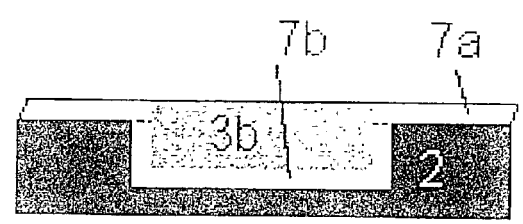
Figure 3D:
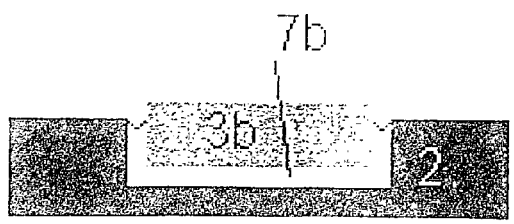
Figure 4D:
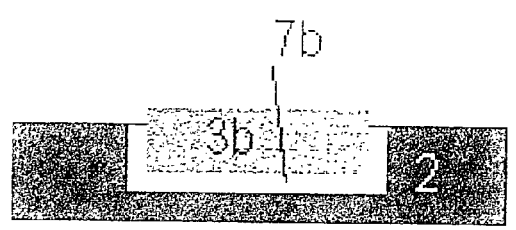

With further action of the etching medium (FIGS. 3c, 4c) in certain areas of the semiconductor substrate (wafer) the barrier layer located on the field is removed and the field exposed (FIG. 3c), while for other areas only barrier layer 7a which is located on the field is exposed (FIG. 4c).

The etchant as claimed in the invention can be used with a wet etching process, i.e. not only with the rotation etching process but also for example in an etching bath.

In the following some examples for the process as claimed in the invention and the etchant as claimed in the invention are indicated:

EXAMPLE 1

Material 3 in the trench: copper
Material 2 into which the trench was etched: $SiO_2$
Width of the trench: less than 1 micron (1.0 micron)
Depth of trench: 0.1 to 1.0 micron (0.3 micron)
Thickness of layer 3a over the field: <1 micron (0.5 micron)
Etchant: 20 parts by volume $H_3PO_4$, concentrated,
   1 part by volume $HNO_3$, concentrated
   1 part by volume water
   also some wetting agent
Speed: 300 to 3000 rpm
Volumetric flow of etchant: 1 l/min
Temperature: room temperature up to 50° C.
Etching rate: 1 to 10 microns/min

EXAMPLE 2

Material 3 in the trench: aluminum
Material 2 into which the trench was etched: $SiO_2$
Width of the trench: <2 microns (1.0 micron)
Depth of trench: 0.1 to 1.0 micron (0.5 micron)
Thickness of layer 3a on the field: <1 micron (0.5 micron)
Etchant: 20 parts by volume $H_3PO_4$, concentrated,
   1 part by volume $HNO_3$, concentrated
   1 part by volume $H_2O$ concentrated,
   0.5 part by volume HCl concentrated
   0.5 part by volume of an organic acid, preferably a short-chain, aliphatic acid such as acetic acid
   0.5 part by volume of an alcohol (preferably a short-chain alcohol such as ethanol) and wetting agent
Speed: 100 to 3000 rpm
Volumetric flow of etchant: 1 l/min
Temperature: room temperature up to 50° C.
Etching rate: 1 to 10 microns/min

EXAMPLE 3

Material 3 in the trench: polycrystalline silicon or a polycrystalline silicide or tungsten, titanium, platinum or gold
Material into which the trench was etched: Silicon
Width of the trench: 1 micron
Depth of trench: 0.1 to 1.0 micron
Thickness of layer 3a on the field: 1 micron
Etchant: concentrated hydrofluoric acid and concentrated nitric acid as the main component and additionally
   an organic acid similar to example 2,
   concentrated phosphoric acid and concentrated sulfuric acid as additional components of the etchant
   1 part by volume water
Speed: 100 to 3000 rpm
Volumetric flow of etchant: 1 l/min
Temperature: room temperature up to 50° C.
Etching rate: 1 to 4 microns/min

EXAMPLE 4

Material 3b in the trench: $SiO_2$
Material into which the trench was etched: silicon
Width of the trench: 1 micron (1 micron)
Depth of trench: 0.1 to 1.0 micron
Thickness of material layer 3a on the field: 1 micron
Etchant: Main components:
   concentrated hydrofluoric acid or a concentrated ammonium chloride ($NH_4F$) solution and
   phosphoric acid and/or polyethylene glycol as additives which increase viscosity
Speed: 100 to 3000 rpm
Volumetric flow of etchant: 1 l/min
Temperature: room temperature up to 50° C.
Etching rate: 1 to 10 microns/min

EXAMPLE 5

Material 3 in the trench: copper
Barrier layer 7: tantalum nitride
Material 2 into which the trench was etched: $SiO_2$
Width of the trench: <1 micron (0.5 micron)
Depth of trench: 0.1 to 1.0 micron (0.2 micron)
Thickness of layer 3a over the field: <1 micron (0.5 micron)
Etchant: 2 parts by volume $Na_4SO_5$ (50%) (component A)
   0.5 part by volume HF concentrated (component B)
   8 parts by volume water
Speed: 300 to 3000 rpm
Volumetric flow of etchant: 1 l/min
Temperature: room temperature
Etching rate: 1 micron/min

EXAMPLE 6

Material 3 in the trench: copper
Barrier layer 7: tantalum nitride
Material 2 into which the trench was etched: $SiO_2$
Width of the trench: <1 micron (0.5 micron)
Depth of trench: 0.1 to 1.0 micron (0.2 micron)
Thickness of layer 3a over the field: <1 micron (0.5 micron)
Etchant: 2 parts by volume $Na_4SO_5$ (50%) (component A)
   0.5 part by volume HF concentrated (component B)
   1.5 parts by volume glycerin (component C)
   8 parts by volume water
Speed: 300 to 3000 rpm
Volumetric flow of etchant: 1 l/min
Temperature: room temperature
Etching rate: 0.5 micron/min The embodiments show that a purely wet chemical process suffices for planarization, therefore the transition from the configuration shown in FIG. 2b to the configuration shown in FIG. 2c in which the coating is present solely in the trench. Planarity, as FIG. 2c shows, is not perfect after application of the process as claimed in the invention, since material 3 in the trench in layer 2 has a slightly concave surface. But planarity for the desired purposes of semiconductor engineering, specifically to be used as conductors or insulator paths (depending on material 3 in the trench), is quite sufficient.

In summary, one embodiment of the invention can be described as follows:

In a process for planarization of semiconductor substrates in which a layer which has been applied to a semiconductor substrate which has a trench and/or contact holes is removed such that the layer remains solely in the area of the trenches or contact holes, instead of as in the prior art the etching medium being applied in drops, the etching medium is applied in a continuous flow with a flow rate of at least 0.4 l/min so that the etching medium covers the entire surface of the semiconductor substrate to be planarized. This technique yields a differentiated etching rate, the etching speed in the area of the fields between the trenches or contact holes being greater than in the area of the trenches themselves, so that as a result the coating applied to the semiconductor substrate is etched away more quickly than in the area of the trenches and finally material remains only in the area of the trenches or contact holes.

What is claimed is:

1. A method of manufacturing semiconductor devices, comprising:
    forming an insulating layer over a semiconductor substrate;
    forming contact holes in the insulating layer;
    forming a conductive layer over the insulating layer to bury the contact holes;
    rotating the semiconductor substrate; and
    etching the conductive layer by supplying an etching composition on the rotating semiconductor substrate without performing a polishing step prior to said etching,
    wherein the etching composition comprises a mixture of at least one oxidant selected from the group consisting of $S_2O_8^-$ and $HNO_3$, at least one enhancer selected from the group consisting of HF, $H_3PO_4$, $H_2SO_4$, and HCl, and a buffer solution, and
    wherein the oxidant, the enhancer, and the buffer solution have a mixing ratio such that after the etching, the material of the conductive layer is only present inside the contact hole and does not remain over the insulating layer.

2. A method of manufacturing semiconductor devices, as recited in claim 1, wherein the buffer solution comprises water.

3. A method of manufacturing semiconductor devices, as recited in claim 1, wherein the conductive layer comprises a material selected from the group consisting of tungsten (W), copper (Cu), and polysilicon.

4. A method of manufacturing semiconductor devices, as recited in claim 3, further comprising forming a barrier metal layer over the semiconductor substrate and the insulating layer, after forming contact holes in the insulating layer, but before forming the conductive layer.

5. A method of manufacturing semiconductor devices, as recited in claim 4, wherein the barrier metal layer comprises a material selected from the group of Ti, TiN, Ta, and TaN.

6. A method of manufacturing semiconductor devices, as recited in claim 1, wherein the etching composition is supplied by a nozzle placed over the semiconductor substrate, the nozzle being moved either to the right of center or to the left of center of the semiconductor substrate.

7. A method of manufacturing semiconductor devices, as recited in claim 1, wherein the processing temperature of the etching composition is in the range of room temperature to 50° C.

8. A method of manufacturing semiconductor devices, as recited in claim 7, wherein the semiconductor substrate is heated to about the processing temperature of the etching composition.

9. A method of manufacturing semiconductor devices comprising the steps of:
    forming a pattern structure over a semiconductor substrate;
    forming an interlayer dielectric layer over the semiconductor substrate and the pattern structure;
    rotating the semiconductor substrate; and
    etching the interlayer dielectric layer by supplying on the rotating semiconductor substrate an etching composition comprising a mixture of at least one oxidant selected from the group consisting of $S_2O_8^-$, and $HNO_3$, at least one enhancer selected from the group consisting of HF, $H_3PO_4$, $H_2SO_4$, $NH_4F$, and HCl, and a buffer solution,
    wherein the oxidant, enhancer, and buffer solution are mixed in a certain mixing ratio such that the etching planarizes the interlayer dielectric layer.

10. A method of manufacturing semiconductor devices, as recited in claim 9, wherein the interlayer dielectric layer comprises an oxide.

11. A method of manufacturing semiconductor devices, as recited in claim 9, wherein the etching composition is supplied by a nozzle placed over the semiconductor substrate, the nozzle being moved either to the right of center or to the left of center of the semiconductor.

12. A method of manufacturing semiconductor devices, as recited in claim 9, wherein the semiconductor substrate is heated to about the processing temperature of the etching composition.

* * * * *